United States Patent
Honda et al.

(10) Patent No.: US 9,851,453 B2
(45) Date of Patent: Dec. 26, 2017

(54) METHOD OF MANUFACTURING RADIOLOGICAL IMAGE CONVERSION PANEL AND RADIOLOGICAL IMAGE CONVERSION PANEL

(71) Applicant: ULVAC, INC., Kanagawa (JP)

(72) Inventors: Kazuhiro Honda, Kanagawa (JP); Shuji Osono, Kanagawa (JP); Hideaki Zama, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 0 days.

(21) Appl. No.: 14/713,681

(22) Filed: May 15, 2015

(65) Prior Publication Data

US 2015/0338528 A1 Nov. 26, 2015

(30) Foreign Application Priority Data

May 20, 2014 (JP) .................... 2014-104774

(51) Int. Cl.
*G01T 1/20* (2006.01)
*C23C 16/455* (2006.01)
*G01T 1/202* (2006.01)
*G21K 4/00* (2006.01)

(52) U.S. Cl.
CPC ...... *G01T 1/2002* (2013.01); *C23C 16/45525* (2013.01); *G01T 1/202* (2013.01); *G21K 4/00* (2013.01); *G21K 2004/06* (2013.01)

(58) Field of Classification Search
CPC .................................................. G01T 1/2002
See application file for complete search history.

(56) References Cited

U.S. PATENT DOCUMENTS

| 2003/0178570 A1* | 9/2003 | Tsunota | ............. G01T 1/2002 250/370.11 |
| 2005/0089142 A1* | 4/2005 | Marek | ............. C09K 11/616 378/98.8 |

FOREIGN PATENT DOCUMENTS

JP 2012-159305 A 8/2012

OTHER PUBLICATIONS

Translation of JP2012159305 which was presented in applicant's IDS.*

* cited by examiner

*Primary Examiner* — David Porta
*Assistant Examiner* — Hugh H Maupin
(74) *Attorney, Agent, or Firm* — Cermak Nakajima & McGowan LLP; Tomoko Nakajima (57) ABSTRACT

A radiological image conversion panel, having a phosphor layer containing therein a fluorescent substance which emits light through radiation exposure, is manufactured by forming the fluorescent substance into respective columnar structures on one of surfaces of a substrate to thereby obtain a phosphor layer made up of a group of columnar structures. The panel is subsequently manufactured by forming reflection films by respectively covering an outer surface of each of the columnar structures with a reflection film while leaving a gap between respective adjoining columnar structures, the reflection film being arranged to reflect light of a predetermined wavelength. In case a refractive index of the gap is lower than a refractive index of the columnar structures, the reflection films are formed of an inorganic material having a higher refractive index than the refractive index of the columnar structures.

5 Claims, 6 Drawing Sheets

METHOD OF MANUFACTURING RADIOLOGICAL IMAGE CONVERSION PANEL AND RADIOLOGICAL IMAGE CONVERSION PANEL

BACKGROUND OF THE INVENTION

1. Field of the Invention

The present invention relates to a method of manufacturing a radiological image conversion panel and also relates to a radiological image conversion panel.

2. Background of the Related Art

This kind of radiological image conversion panel is used in an indirect type (X-ray indirect conversion system) of radiation detector together with a sensor panel having a plurality of photoelectric conversion elements. This kind of radiation detector is known, e.g., in JP-A-2012-159305. The radiation detector has a phosphor layer (scintillator) made up of a group of columnar structures formed on one of surfaces of a substrate with fluorescent crystals being respectively formed in the form of columns. In this arrangement, the light generated inside each of the columnar structures through radiation exposure is caused to be propagated while being confined within the columnar structures by taking advantage of the difference between the refractive index of the columnar structures and the refractive index of the gaps (air) between the columnar structures (optical confinement effect). The light is caused to be incident on the photoelectrical conversion elements respectively disposed opposite to the columnar structures. The light is thus converted into electrical signals (image signals) depending on the amount of light.

If the light generated in the columnar structures gets leaked outside without being confined to the columnar structures, the leaked light will be incident on columnar structures other than the photoelectrical conversion elements on which the light is originally intended to be incident. The amount of light will then become insufficient in the photoelectrical conversion elements on which the light is originally intended to be incident. On the other hand, the amount of light increases in the photoelectrical conversion elements into which additional light is caused to be incident. As a result, the quality of image is deteriorated. Therefore, in order to obtain clear images in the radiation detector, it becomes important how the leaking light to the outside of the columnar structures can be suppressed.

As a solution, in the above-described conventional example, the following proposal is made. Let that side of the columnar structures which lie on the side of the substrate be defined as a base end and let that side of the columnar structures which lie on the side of the photoelectric conversion elements be defined as a front end. Then, the front end of the group of columnar structures is covered with a reflection film which is made of a metal or a metal alloy. However, if the reflection film is formed in a manner to fill the gaps between the front ends of the adjoining columnar structures, the light will be reflected only on the interface between the columnar structures and the reflection film. Further, since there is no reflection film on the side of the base end of the substrate, there is a limit in effectively suppressing the light from leaking to the outside of the columnar structures.

BRIEF SUMMARY OF THE INVENTION

In view of the above-described points, this invention has an advantage of providing a method of manufacturing a radiological image conversion panel as well as a radiological image conversion panel in which leaking of light out of columnar structures of a phosphor layer can be effectively suppressed.

In order to solve the above problems, the present invention is a method of manufacturing a radiological image conversion panel comprising a phosphor layer containing therein a fluorescent substance which emits light through radiation exposure. The method comprises the step of forming the fluorescent substance into respective columnar structures on one of surfaces of a substrate to thereby obtain a phosphor layer made up of a group of columnar structures. The method further comprises the step of forming reflection films by respectively covering an outer surface of each of the columnar structures with a reflection film while leaving a gap between respective adjoining columnar structures. The reflection film is arranged to reflect light of a predetermined wavelength. In case a refractive index of the gap is lower than a refractive index of the columnar structures, the reflection films are formed of an inorganic material having a higher refractive index than the refractive index of the columnar structures. In this invention, the term "gap" (or clearance) refers not only to the case where the atmosphere (refractive index 1) is present between the respective adjoining columnar structures, but also to the case where a material having a lower refractive index than the refractive index of the columnar structures is buried in the gap. Further, according to this invention, the feature of forming the reflection films of an inorganic material refers not only to a case where the reflection film is formed of a single-layer film of an inorganic material, but also to a case where the reflection film is formed of a laminated film of different inorganic materials.

According to this invention, the light generated in the columnar structures through radiation exposure will be propagated along the inside of the columnar structures while reflecting over the entire length of the columnar structures not only along the interfaces between the columnar structures and the reflection films, but also along the outer surfaces (the surfaces on the side of the gaps) of the reflection films. Therefore, the leaking of light out of the columnar structures can be effectively suppressed. As a result, when the radiological image conversion panel obtained by this invention is applied to a radiation detector, the light propagated along the inside of the columnar structures can be made to be incident on the photoelectric conversion elements on which the light is originally intended to be incident. Therefore, the quality of the image can be improved.

In this invention, in case the columnar structures have deliquescent characteristics, preferably the method further comprises, prior to the step of forming the reflection films, the step of forming a moisture-proof film in a manner to cover the outer surface of each of the columnar structures. The moisture-proof film is formed of an inorganic material having a lower refractive index than the refractive index of the reflection films. Therefore, the above-described effect of suppressing the light from leaking out of the columnar structures is not impaired. Further, even in case the moisture-proof film is deteriorated through reaction with water, since the reflection film is present on an outside of the moisture-proof film, the shape of the columnar structures as well as the shape of the radiological image conversion panel can be maintained. In this case, aluminum oxide film is preferably used as the moisture-proof film, and zinc oxide film is preferably used as the reflection film. By the way, the feature in this invention in that the moisture-proof film is made of an inorganic material applies not only to the case where the moisture-proof film is formed of a single-layer film of an inorganic material, but also to the case where the moisture-proof film is formed of a laminated film of different inorganic materials.

Further, in order to solve the above-described problems, this invention is a method of manufacturing a radiological image conversion panel comprising a phosphor layer containing therein a fluorescent substance which emits light through radiation exposure. The method comprises the step of forming the fluorescent substance into respective columnar structures on one of surfaces of a substrate to thereby obtain a phosphor layer made up of a group of columnar structures. The method further comprises the step of forming reflection films by respectively covering an outer surface of each of the columnar structures with a reflection film while leaving a gap between respective adjoining columnar structures. The reflection film is arranged to reflect light of a predetermined wavelength. In case a refractive index of the gap is higher than a refractive index of the columnar structures, the reflection films are formed of an inorganic material having a lower refractive index than the refractive index of the columnar structures.

According to the above-described invention, the light generated in the columnar structures through radiation exposure will be propagated along the inside of the columnar structures while reflecting over the entire length of the columnar structures not only on the interfaces between the columnar structures and the reflection films, but also on the outer surfaces (the surfaces on the side of the gaps) of the reflection films. Therefore, the leaking of light out of the columnar structures can be effectively suppressed. As a result, when the radiological image conversion panel obtained by this invention is applied to a radiation detector, the light propagated along the inside of the columnar structures can be made to be incident on the photoelectric conversion elements on which the light is originally intended to be incident. Therefore, the quality of the image can be improved.

The method of manufacturing a radiological image conversion panel according to this invention preferably further comprises the step of filling the gaps with a reflection material having a higher refractive index than the refractive index of the fluorescent substance.

In this invention in case the columnar structures have deliquescent characteristics, the method preferably further comprises, prior to the step of forming the reflection films, the step of forming a moisture-proof film in a manner to cover the outer surface of each of the columnar structures. Then, the deliquescence of the columnar structures can advantageously be suppressed. Furthermore, by arranging that the moisture-proof film is made of an inorganic material having a higher refractive index than the refractive index of the reflection films, effect of suppressing the light from leaking out of the columnar structures is not impaired. Further, even in case the moisture-proof film is deteriorated through reaction with water, since the reflection film is present on the outside of the moisture-proof film, the shape of the columnar structures as well as the shape of the radiological image conversion panel can be maintained.

The reflection films are preferably formed by atomic layer deposition method. According to this arrangement, the outer surface of the respective columnar structures can be covered by the thin reflection film that is formed of an inorganic material. Therefore, the gaps can surely be secured between the columnar structures.

In order to solve the above problems, there is provided a radiological image conversion panel comprising a substrate and a phosphor layer which is made up of a group of columnar structures of the fluorescent substance formed into respective columnar structures on one of surfaces of the substrate. The radiological image conversion panel further comprises a reflection film which reflects light of a predetermined wavelength, and the reflection film covers an outer surface of each of the columnar structures. In case a refractive index of the columnar structures is higher than a refractive index of a gap between respective adjoining columnar structures, the reflection film is formed of an inorganic material having a higher refractive index than the refractive index of the columnar structures.

In this invention, in case the columnar structures have deliquescent characteristics, the radiological image conversion panel preferably further comprises a moisture-proof film covering an outer surface of each of the columnar structures, between the outer surface of each of the columnar structures and the reflection film. The moisture-proof film is preferably formed of an inorganic material having a lower refractive index than the refractive index of the reflection films.

In order to solve the above problems, there is provided a radiological image conversion panel comprising a substrate and a phosphor layer which is made up of a group of columnar structures of the fluorescent substance formed into respective columnar structures on one of surfaces of the substrate. The radiological image conversion panel further comprises a reflection film which reflects light of a predetermined wavelength, and the reflection film is arranged to cover an outer surface of each of the columnar structures. In case a refractive index of the columnar structures is lower than a refractive index of a gap between respective adjoining columnar structures, the reflection film is formed of an inorganic material having a lower refractive index than the refractive index of the columnar structures. This invention includes a case in which a reflection material with a higher refractive index than a refractive index of the columnar structures, is filled into the gaps.

In this invention, in case the columnar structures have deliquescent characteristics, the radiological image conversion panel preferably further comprises a moisture-proof film which covers the outer surface of each of the columnar structures, between the outer surface of each of the columnar structures and the reflective film. The moisture-proof film is further formed of an inorganic material having a higher refractive index than the refractive index of the reflection films.

DETAILED DESCRIPTION OF PREFERRED EMBODIMENTS

With reference to the accompanying drawings, a description will now be made of a radiological image conversion panel according to an embodiment of this invention by taking as an example in which this invention is applied to an X-ray indirect conversion system of detector. In each of the drawings the elements common to all are referenced with the same reference numerals and alphabets, so that repeated explanations are omitted.

Figure 1:
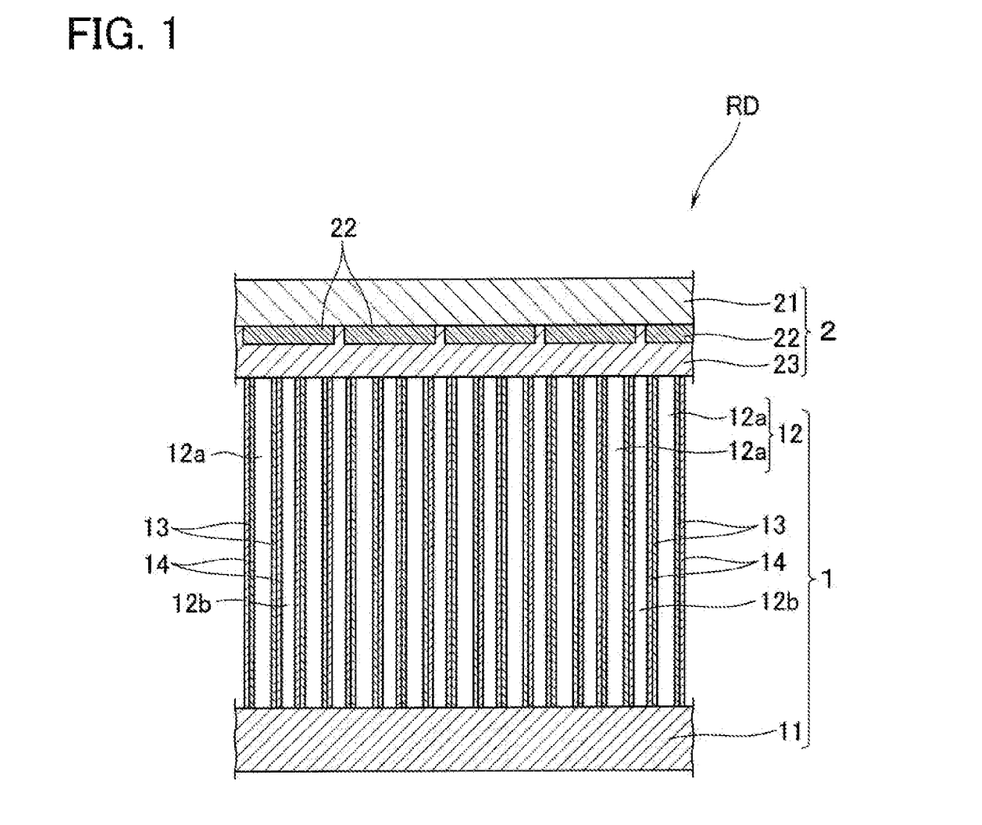
FIG. 1 is a schematic sectional view showing a radiation detector to which is applied a radiological image conversion panel according to an embodiment of this invention.

With reference to FIG. 1, alphabetical reference mark RD denotes a radiation detector, which is made up of a radiation image conversion panel 1 and a sensor panel 2. The radiation image conversion panel 1 is provided with a substrate 11 and a phosphor layer (scintillator) 12 which is formed on one of surfaces of the substrate 11. As the substrate 11 there may be used a carbon plate, glass plate, quartz substrate, sapphire substrate, and the like but, without being limited to the above, there may also be used a substrate that is capable of forming thereon columnar structures 12a as described hereinbelow. The phosphor layer 12 is made up of a group of columnar structures 12a in which the fluorescent substance is respectively formed into columnar structures. The columnar structures 12a are made up of a group of columnar structures 12a each being obtained by forming fluorescent substance into the shape of respective columns. These columnar structures 12a can be made up of columnar crystals that can be obtained, e.g., as a result of crystal growth. As the material for making up the columnar structures 12a, there may be used one which is selected from one of CsI:Tl, NaI:Tl, GOS ($Gd_2O_2S$), and the like. A description will now be made of an example in which there was used as the fluorescent substance making up the columnar structure 12a, CsI:Tl which has a luminous wavelength of 540 nm, a refractive index of 1.79, and deliquescent characteristics.

The above-described radiological image conversion panel 1 is arranged such that an outer surface of each of the columnar structures 12a made of CsI:Tl is covered with a moisture-proof film 13 having moisture-proof characteristics (or water vapor barrier properties), while leaving or maintaining a gap 12b between the respectively adjoining columnar structures 12a. In addition, the surface of the moisture-proof film 13 is covered with a reflection film 14 which reflects the light of predetermined wavelengths (visible light), while leaving a gap 12b between the respectively adjoining columnar structures 12a. In this embodiment, since the gaps 12b between the columnar structures 12a are filled with air the refractive index of which is 1, the refractive index of the gaps 12b is arranged to be lower than the refractive index of the columnar structures 12a. The reflection film 14 is formed of an inorganic material such as zinc oxide, silicon nitride, titanium oxide, zinc sulfide, niobium oxide, and the like which has a higher refractive index than the refractive index of the columnar structures 12a. The moisture-proof film 13 is formed of an inorganic material such as aluminum oxide, silicon oxide and the like which has a lower refractive index than the refractive index of the reflection film 14. The moisture-proof film 13 and the reflection film 14 may be formed not only by single-layer films of the above-described inorganic material but also by laminated films of different inorganic materials. As a method of forming these moisture-proof film 13 and the reflection film 14, it is preferable to use an atomic layer deposition method (ALD method), but other forming methods such as CVD and the like may also be used. In case the columnar structures 12a are made of CsI:Tl, the reflection film 14 shall preferably be formed of a zinc oxide film having a refractive index of 1.9-2.0, and the moisture-proof film 13 shall preferably be formed of an aluminum oxide film having a refractive index of 1.63. According to this arrangement, by covering the aluminum oxide film 13 with the zinc oxide film 14 that does not react with moisture, the aluminum oxide film 13 can be prevented from deteriorating through reaction thereof with moisture. Even if the aluminum oxide film 13 is deteriorated, the shape of the columnar structures 12a and consequently the shape of the radiological image conversion panel 1 can be maintained.

The above-described sensor panel 2 is provided with a substrate 21, a plurality of photoelectric conversion elements 22 formed on the surface of the substrate 21, and a protective film 23 that covers these photoelectric conversion elements 22. The photoelectric conversion elements 22 are respectively disposed opposite to the columnar structures 12a such that, once the light propagated along the inside of the columnar structures 12a gets incident on the photoelectric conversion elements 22, the light is converted to an electrical signal (image signal) dependent on the amount of the incident light. As the sensor panel 2 there may be used one having a known construction. Therefore, detailed explanation thereof is omitted here.

Figure 2:
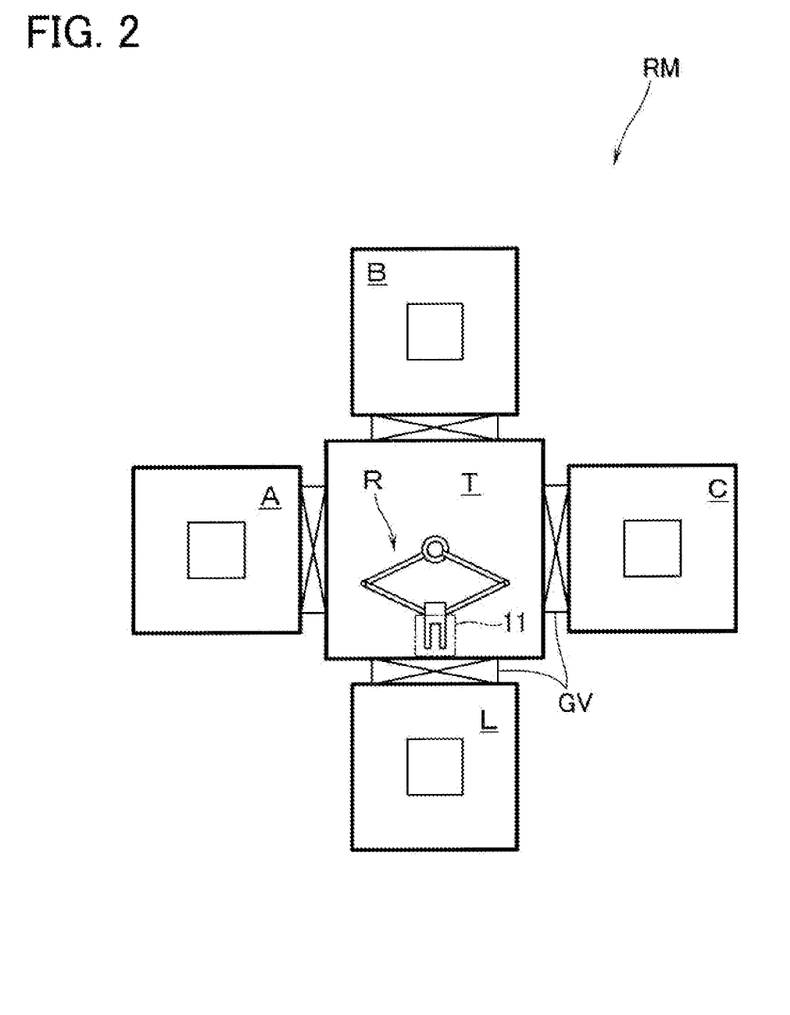
FIG. 2 is a plan view showing a manufacturing apparatus which is used in manufacturing the radiological image conversion panel.

Next, a description will now be made of an apparatus for manufacturing a radiological image conversion panel (hereinafter simply referred to as a "manufacturing apparatus") RM which is used in manufacturing the above-described radiological image conversion panel 1. The manufacturing apparatus RM illustrated in FIG. 2 is provided with a transfer chamber T in the center. This transfer chamber T has disposed therein a transfer robot R which transfers the substrate 11. As the transfer robot R there may be used a so-called frog-leg type of robot as illustrated, as well as other types of known robots. Therefore, detailed explanation thereof is omitted here. To the transfer chamber T there is connected vacuum exhaust means (not illustrated) so that the transfer chamber T can be maintained in a predetermined vacuum degree. The transfer chamber T is formed into the shape of a square in plan view (i.e., as seen from top) and has connected to the circumference thereof a load-lock chamber L and each of processing chambers A-C with a gate valve GV being interposed therebetween. In the processing chamber A phosphor layer 12 is formed by a vacuum vapor deposition method, in the processing chamber B moisture-proof film 13 is formed by atomic layer deposition method, and in the processing chamber C reflection film 14 is formed by atomic layer deposition method. Alternatively, the moisture-proof film 13 and the reflection film 14 may be formed in the same processing chamber. As the processing chamber A in which the phosphor layer 12 is formed by a vacuum vapor deposition method, there may be used one having a known construction. Therefore, detailed explanation thereof is omitted here.

Figure 3:
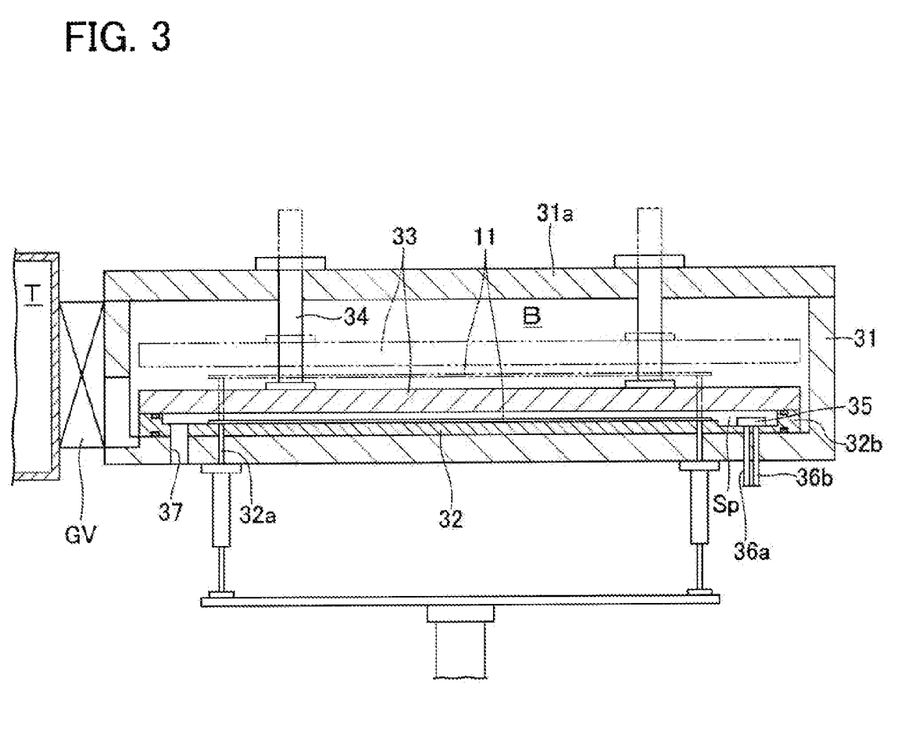
FIG. 3 is a side view, partly shown in section, explaining in concrete a processing chamber B as shown in FIG. 2.

With reference to FIG. 3 a description will be made in concrete of the above-described processing chamber B. Since the above-described processing chamber C has a construction that is similar to that of processing chamber B, explanation thereof will be omitted here. The above-described manufacturing apparatus RM is provided with a vacuum chamber 31 which defines the processing chamber B. On a ceiling portion of the vacuum chamber 31 there is mounted a top plate 31a. In the following description, the direction looking toward the ceiling portion of the vacuum chamber 31 is defined as "up (or upper side)" and the direction looking toward the bottom side thereof is defined as "down (or lower side)." At the bottom portion of the vacuum chamber 31 there is provided a support member (stage) 32 which contains therein heating means such as a heater and the like (not illustrated), and an upper plate 33 which is movable up and down is mounted on the support member 32 in a manner to lie opposite to each other. To an upper surface of the upper plate 33 there is connected a driving shaft 34 of driving means (not illustrated). It is thus so arranged, by moving the driving shaft 34 in the up or down direction, that the upper plate 33 can be moved between a processing position illustrated in thick lines and a transferring position illustrated in imaginary lines. The support member 32 is provided with a lift pin 32a which is movable up and down. By lifting the lift pin 32a in a state in which the upper plate 33 has been lifted to the transferring position, the substrate 11 can be transferred. A side wall 32b is vertically disposed along the periphery portion of the support member 32b. When the lower surface of the upper plate 33 that has been lowered to the processing position comes into contact with the upper surface of the substrate 11, there is defined a reaction space Sp of a smaller volume inside the processing chamber B.

The above-described manufacturing apparatus RM is provided with a gas nozzle 35 which faces the reaction space Sp. The gas nozzle 35 has connected thereto two gas pipes 36a, 36b which are in communication with different gas sources so that the first and the second raw gases can be supplied to the reaction space Sp in a pulsed manner. For example, as the first raw gas to be supplied from the gas pipe 36a, aluminum trimethyl gas can be used. As the second raw gas to be supplied from the gas pipe 36b, $H_2O$ gas, oxygen or ozone can be used. As the carrier gas for the raw gases, inert gas such as argon gas or nitrogen gas can be used.

At the bottom of the vacuum chamber 31 there is provided an exhaust gas pipe 37 which is in communication with the vacuum exhaust means such as vacuum pump, and the like (not illustrated). It is thus possible to evacuate the processing chamber B and also to control the pressure in the reaction space Sp to a predetermined pressure.

Although not illustrated, the above-described manufacturing apparatus RM is provided with a known control means having a microcomputer, a sequencer, and the like. It is thus so arranged that the control means performs an overall control over the operation of the transfer robot R, the operation of the lift pin 32a and the upper plate 33, the supply of raw gas, the operation of the vacuum exhaust means, and the like. A description will now be made of a method of manufacturing the above-described radiological image conversion panel RP by using the above-described manufacturing apparatus RM.

Figure 4A:
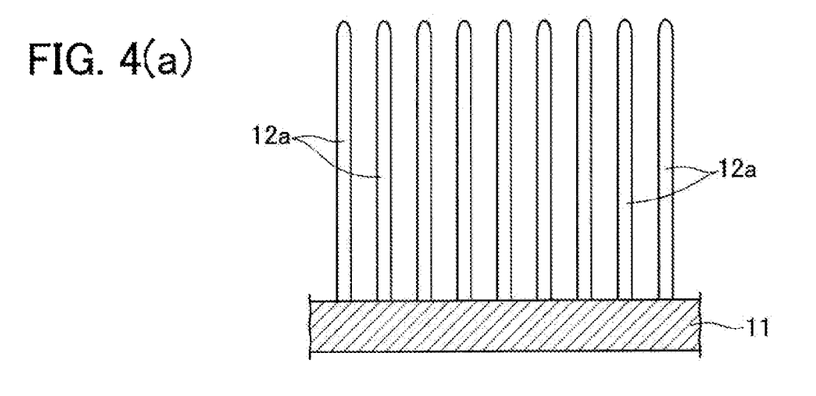
FIGS. 4(a) through 4(c) are schematic side views, partly shown in section, showing the process of manufacturing the radiological image conversion panel according to an embodiment of this invention.

First, the substrate 11 is housed into the load lock chamber L and the load lock chamber L is evacuated. Then, after setting in position the substrate 11 by the transfer robot R onto the stage inside the processing chamber A, the evacuating means is operated to evacuate the processing chamber A to a predetermined vacuum degree (e.g., $1\times10^{-5}$ Pa). Thereafter, by means of the vacuum deposition method, a phosphor layer 12 is formed on the surface of the substrate 11 by forming a group of columnar structures 12a made of CsI:Tl to a length of 100-1000 μm (see FIG. 4(a)).

Figure 4B:
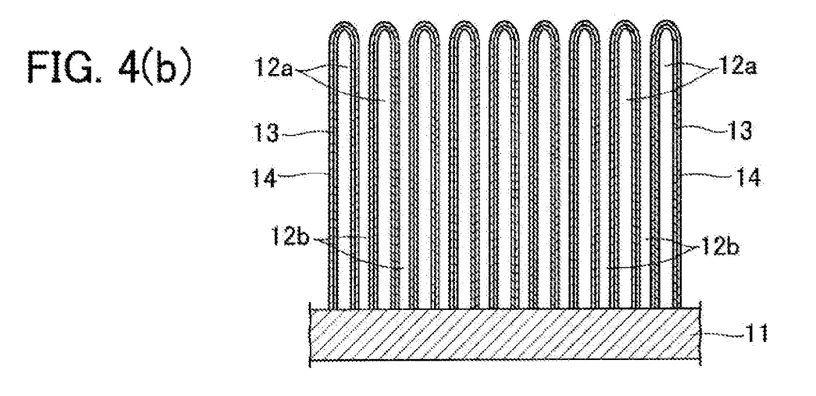

The substrate 11 on which the above-described phosphor layer 12 has been formed is set in position by the transfer robot R onto the support member 32 in the processing chamber B. Thereafter, the upper plate 33 is lowered to define the reaction space Sp. Then, the substrate 11 is heated to a temperature of 80-150° C. and the reaction space Sp is supplied with aluminum trimethyl gas (carrier gas: $N_2$ gas) and $H_2O$ gas in a pulsed state. In this manner, as illustrated in FIG. 4(b), the outer surfaces of the columnar structures 12a are respectively coated with an aluminum oxide film, which serves as a moisture-proof film 13, while leaving a gap 12b between the respectively adjoining columnar structures 12a (step of forming moisture-proof film). The thickness of the moisture-proof film 13 can be set within a range of 10-100 nm. After having formed the aluminum oxide film 13, the introduction of the gas into the reaction space Sp is stopped. The upper plate 33 is lifted and the lift pin 32a is also lifted.

Figure 4C:
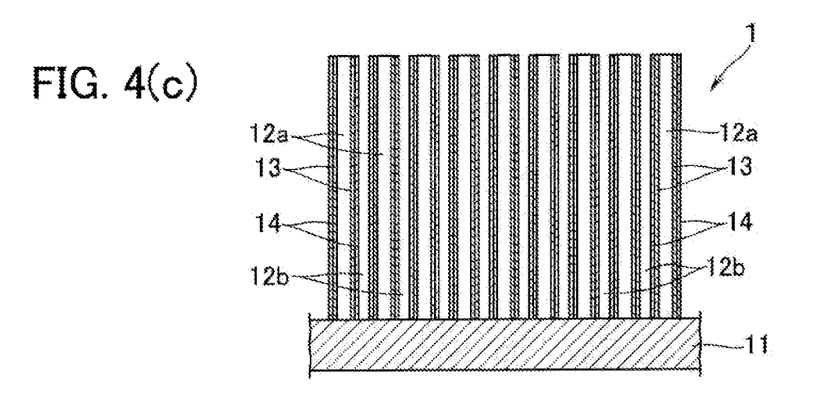

The substrate 11 on which is formed the above-described aluminum oxide film 13 is set in position by the transfer robot R onto the support member 32 in the processing chamber C. Thereafter, in a manner similar to the film deposition in the processing chamber B, the upper plate 33 is lowered to define the reaction space Sp. Then, the reaction space Sp is alternately supplied in a pulsed manner with diethylzinc gas (carrier gas: $N_2$ gas) and $H_2O$ gas. In this manner, as illustrated in FIG. 4(b), the surface of the aluminum oxide film 13 is respectively covered with a zinc oxide film serving as a reflection film 14 while leaving a gap 12b between the respectively adjoining columnar structures 12a (reflection film forming step). The thickness of the reflection film 14 may be set to a range of 200-300 nm. Let us define that side of the columnar structures 12a which lies on the side of the substrate 11 as a base end portion, and let us define that side of the columnar structures 12a toward which they grow as a front end portion. Then, by removing the front end portions of the columnar structures 12a by chemical mechanical grinding and the like, there can be obtained a radiological image conversion panel 1 having the construction as illustrated in FIG. 4(c). Instead of forming the moisture-proof film 13 and the reflection film 14 of single-layer films, they may be respectively formed of laminated films. In this case, the film thickness of each of the films constituting the laminated film may be appropriately adjusted to suitable ones.

As explained so far, according to this embodiment, the outer surfaces of the columnar structures 12a are covered with the moisture-proof film 13 and the reflection film 14 while leaving a gap 12b between the respective adjoining columnar structures 12a. As a result, the light generated within the columnar structures 12a through radiation exposure is propagated inside the columnar structures 12a while getting reflected not only on the interface between the columnar structures 12a and the moisture-proof film 13, and the interface between the moisture-proof film 13 and the reflection film 14, but also on the outer surface (surface on the side of the gap 12b) of the reflection film 14. Therefore, the leaking of the light from the columnar structures 12a can be effectively suppressed. As a result, when the radiological image conversion panel 1 obtained by this invention is applied to the radiation detector RD, the light that has propagated along the inside of the columnar structures 12a can be caused to be incident onto the photoelectrical conversion element 22 on which the light is originally intended to be incident. Therefore, the image quality can be improved.

Further, according to this embodiment, since the columnar structures 12a having deliquescent characteristics are covered with the moisture-proof film 13, the columnar structures 12a can be prevented from getting deliquescent. Still furthermore, since the moisture-proof film 13 is covered with the reflection film 14, the moisture-proof film 13 can be prevented from getting deteriorated through reaction with the moisture. Should the moisture-proof film 13 be deteriorated, the shape of the columnar structures 12a and consequently the shape of the radiological image conversion panel 1 can still be maintained.

In order to confirm the above-described effects, the following experiments were made. In these experiments, as the columnar fluorescent substances (columnar structures) 12a, Cs1 was formed on a glass substrate to a thickness of 600 nm by vacuum vapor deposition method. Then, the surface of the fluorescent substance 12a was covered with an aluminum oxide film 13 having a thickness of 50 nm by using the ALD method, and a zinc oxide film 14 was formed, by using the ALD method, on the surface of the aluminum oxide film 13 to a thickness of 300 nm. When the structures thus obtained were placed under the atmospheric tests of 60° C. and 90% relative humidity (RH), it has been confirmed that, even after the lapse of more than 24 hours, the fluorescent substance 12a was not deliquescent. On the other hand, when the radiological image conversion panel that was manufactured in a similar method as that of the above-described method, except for the fact that the zinc oxide film 14 was not formed, was placed under the same atmospheric tests, it has been confirmed that the fluorescent substance 12a was deliquescent at the point of time of 1 hour elapsing. According to the above, it has been confirmed that, by forming the zinc oxide film 14, the radiological image conversion panel can be prevented from getting deteriorated through reaction of the aluminum oxide film 13 with moisture.

Explanation has so far been made of the embodiment of this invention, but this invention shall not be limited to the above. In the above-described embodiment an explanation has been made of an example in which the moisture-proof film 13 was interposed between the columnar structures 12a and the reflection films 14. However, in case the columnar structures 12a do not have deliquescent characteristics, the moisture-proof film 13 may be omitted. In this arrangement, the outer surfaces of the columnar structures 12a are covered by the reflection films 14 while leaving a gap 12b between the respectively adjoining columnar structures 12a. According to this arrangement, the light generated in the columnar structures 12a through radiation exposure will be propagated along the inside of the columnar structures while reflecting over the entire length of the columnar structures not only along the interface between the columnar structures 12a and the reflection films 14, but also along the outer surfaces (the surfaces on the side of the gaps 12b) of the reflection film 14. Therefore, the leaking of light out of the columnar structures can be effectively suppressed.

Figure 5:
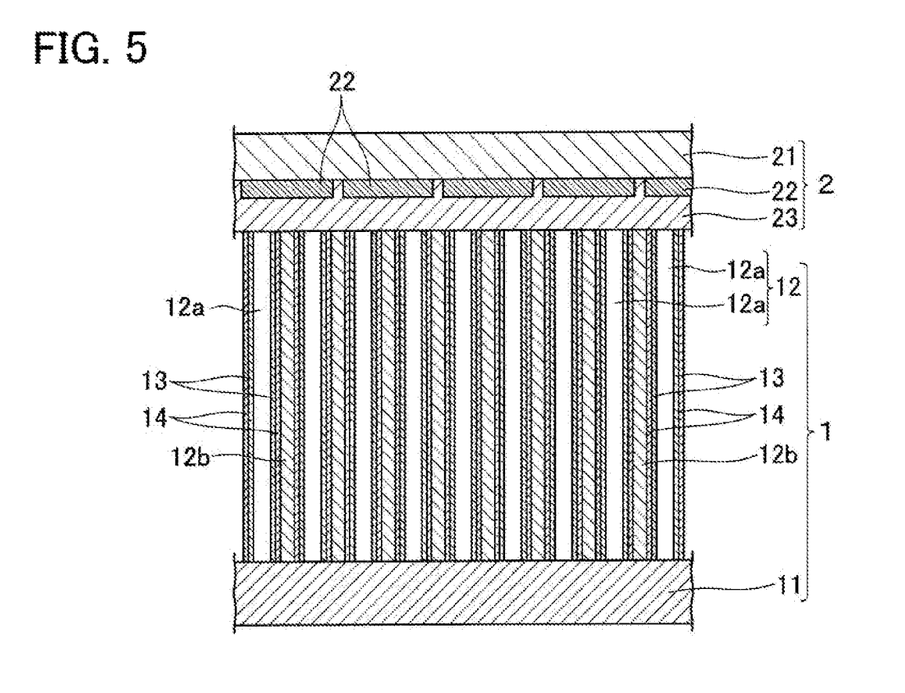
FIG. 5 is a schematic sectional view showing a radiation detector to which is applied a radiological image conversion panel according to an alternative embodiment of this invention.
Figure 6A:
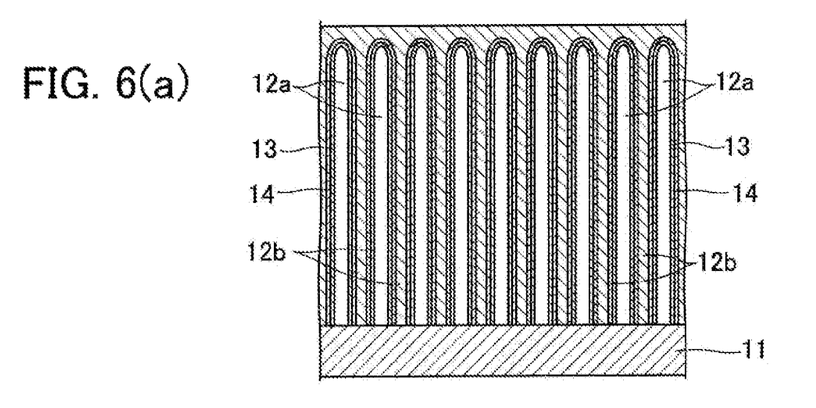
FIGS. 6(a) and 6(b) are schematic side views, partly shown in section, showing the process of manufacturing the radiological image conversion panel according to an alternative embodiment of this invention.
Figure 6B:
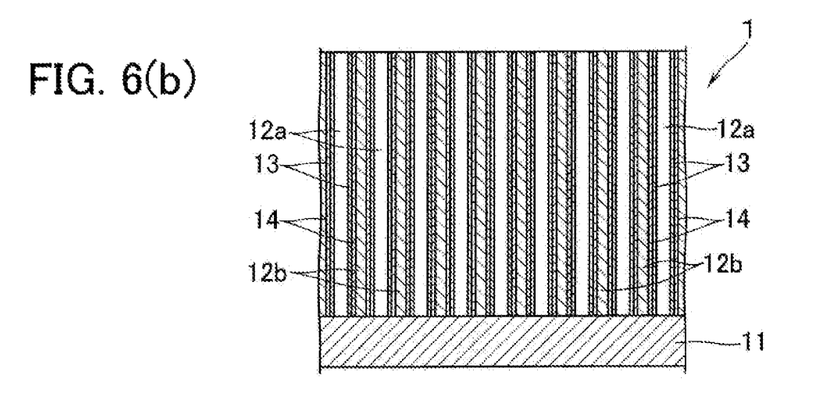

Further, in the above-described embodiment a description was made of an example in which the refractive index of the gaps 12b is lower than the refractive index of the columnar structures 12a. This invention can, however, be applied to a case in which the gaps 12b are filled with titanium oxide having a refractive index of 2.2-2.6 so as to make the columnar structures 12a of Cs1 having a refractive index of 1.79, as illustrated in FIG. 5. In this case, as illustrated in FIG. 6(a), by coating the outer surface of the columnar structures 12a with a reflection film 14 formed of an inorganic material (e.g., silicon oxide) having a lower refractive index than the refractive index of the columnar structures 12a, it is possible, like in the above-described embodiment, to obtain a higher refractive index at the interface between the columnar structures and the reflection film 14, thereby preventing the light from leaking out of the columnar structures 12a. Further, in case the columnar structures 12a have deliquescent characteristics, in a manner similar to the above-described embodiment, it is preferable to interpose the moisture-proof film 13 which covers the outer wall surface of the columnar structures 12a and which is formed of an inorganic material having a higher refractive index than the refractive index of the reflection film 14. After formation of the reflection film 14, the gaps 12b are filled with titanium oxide. Then, like in the above-described embodiment, by removing the front end portions of the columnar structures 12a by chemical mechanical grinding and the like, there can be obtained a radiological image conversion panel 1 having the construction as illustrated in FIG. 6(b).

What is claimed is:

1. A method of manufacturing a radiological image conversion panel comprising a phosphor layer containing therein a fluorescent substance which emits light through radiation exposure, the method comprising the step of forming the fluorescent substance into respective columnar structures on one of surfaces of a substrate to thereby obtain a phosphor layer made up of a group of columnar structures;

forming a moisture-proof film in a manner to cover an entire outer surface of each of the columnar structures, wherein the columnar structures have deliquescent characteristics, and wherein the moisture-proof film is formed of an inorganic material having a lower refractive index than the refractive index of the columnar structures; and after forming the moisture-proof film, forming reflection films by respectively covering the entire outer surface of each of the columnar structures with a reflection film while leaving a gap between respective adjoining columnar structures, the reflection film being arranged to reflect light of a predetermined wavelength; wherein a refractive index of the gap is lower than a refractive index of the columnar structures, and the reflection films are formed of an inorganic material having a higher refractive index than the refractive index of the columnar structures.

2. The method of manufacturing a radiological image conversion panel according to claim 1, wherein the reflection films are formed by atomic layer deposition method in the step of forming reflection films.

3. A method of manufacturing a radiological image conversion panel comprising a phosphor layer containing therein a fluorescent substance which emits light through radiation exposure, the method comprising the step of forming the fluorescent substance into respective columnar structures on one of surfaces of a substrate to thereby obtain a phosphor layer made up of a group of columnar structures, the method further comprising the step of:

forming a moisture-proof film in a manner to cover an entire outer surface of each of the columnar structures, wherein the columnar structures have deliquescent characteristics, and wherein the moisture-proof film is formed of an inorganic material having a higher refractive index than the refractive index of the reflection films; and after forming the moisture-proof film, forming reflection films by respectively covering an entire outer surface of each of the columnar structures with a reflection film while leaving a gap between respective adjoining columnar structures, the reflection film being arranged to reflect light of a predetermined wavelength, wherein a refractive index of the gap is higher than a refractive index of the columnar structures, and the reflection films are formed of an inorganic material having a lower refractive index than the refractive index of the columnar structures.

4. A radiological image conversion panel comprising:
a substrate and a phosphor layer which is made up of a group of columnar structures of the fluorescent substance formed into respective columnar structures on one of surfaces of the substrate;
a moisture-proof film covering an outer surface of each of the columnar structures between the outer surface of each of the columnar structures and the reflection film, wherein the moisture-proof film is formed of an inorganic material having a lower refractive index than the refractive index of the reflection films; and
a reflection film which reflects light of a predetermined wavelength, the reflection film covering an entire outer surface of each of the columnar structures, wherein a refractive index of the columnar structures is higher than a refractive index of a gap between respective adjoining columnar structures, and the reflection film is formed of an inorganic material having a higher refractive index than the refractive index of the columnar structures.

5. A radiological image conversion panel comprising:
a substrate and a phosphor layer which is made up of a group of columnar structures of the fluorescent substance formed into respective columnar structures on one of surfaces of the substrate;
a moisture-proof film covering the outer surface of each of the columnar structures between the outer surface of each of the columnar structures and the reflective film, wherein the moisture-proof film is formed of an inorganic material having a higher refractive index than the refractive index of the reflection films; and
a reflection film which reflects light of a predetermined wavelength, the reflection film being arranged to cover an entire outer surface of each of the columnar structures;
wherein a refractive index of the columnar structures is lower than a refractive index of a gap between respective adjoining columnar structures, and the reflection film is formed of an inorganic material having a lower refractive index than the refractive index of the columnar structures.

* * * * *